(12) United States Patent
Sejima et al.

(10) Patent No.: US 9,041,405 B2
(45) Date of Patent: May 26, 2015

(54) CONDITION ESTIMATION DEVICE AND METHOD OF GENERATING OPEN CIRCUIT VOLTAGE CHARACTERISTIC

(71) Applicant: GS Yuasa International Ltd., Kyoto-shi (JP)

(72) Inventors: Kenichi Sejima, Kyoto (JP); Yoshihiko Mizuta, Kyoto (JP); Masashi Nakamura, Kyoto (JP); Hiroshi Sekiguchi, Kyoto (JP); Hidefumi Hasegawa, Kyoto (JP); Shinya Kitano, Kyoto (JP)

(73) Assignee: GS Yuasa International Ltd., Kyoto-shi, Kyoto (JP)

( * ) Notice: Subject to any disclaimer, the term of this patent is extended or adjusted under 35 U.S.C. 154(b) by 31 days.

(21) Appl. No.: 14/024,532

(22) Filed: Sep. 11, 2013

(65) Prior Publication Data

US 2014/0084939 A1    Mar. 27, 2014

(30) Foreign Application Priority Data

Sep. 21, 2012  (JP) ................................. 2012-208490

(51) Int. Cl.
*G01N 27/416*    (2006.01)
*G01R 31/36*    (2006.01)

(52) U.S. Cl.
CPC ........ *G01R 31/3606* (2013.01); *G01R 31/3637* (2013.01); *G01R 31/3634* (2013.01); *G01R 31/3651* (2013.01)

(58) Field of Classification Search
CPC ........... G01R 31/3606; G01R 31/3634; G01R 31/3637; H01M 10/42; H01M 10/48

USPC .................................................. 324/427, 426
See application file for complete search history.

(56) References Cited

U.S. PATENT DOCUMENTS

| 8,415,954 | B2 | 4/2013 | Akamine et al. |
| 2010/0156351 | A1* | 6/2010 | Ugaji et al. ................... 320/132 |
| 2010/0247988 | A1 | 9/2010 | Okumura et al. |
| 2011/0156713 | A1 | 6/2011 | Akamine et al. |
| 2013/0030739 | A1* | 1/2013 | Takahashi et al. .............. 702/63 |

(Continued)

FOREIGN PATENT DOCUMENTS

| JP | 2000-131404 A | 5/2000 |
| JP | 2010-066232 A | 3/2010 |

(Continued)

*Primary Examiner* — Amy He
(74) *Attorney, Agent, or Firm* — McGinn IP Law Group, PLLC (57) ABSTRACT

A condition estimation device includes a voltage measurement circuit, memory, and a controller. The voltage measurement circuit measures an open circuit voltage (OCV) of an electric storage device. The memory is configured to store first information on a correlation between a positive electrode potential and an electric storage capacity and second information on a correlation between a negative electrode potential and an electric storage capacity. The controller is configured to: measure an OCV under charge or discharge; calculate an electric storage capacity of the electric storage device having the OCV equal to a reference voltage; correct at least one of the first information and the second information such that a potential difference at the calculated capacity is equal to the reference voltage; and generate an OCV characteristic based on the first and the second information after the at least one of the first and the second information is corrected.

10 Claims, 9 Drawing Sheets

(56) References Cited

U.S. PATENT DOCUMENTS

| | | |
|---|---|---|
| 2013/0076363 A1 | 3/2013 | Takahashi et al. |
| 2013/0099794 A1 | 4/2013 | Takahashi et al. |

FOREIGN PATENT DOCUMENTS

| | | |
|---|---|---|
| JP | 2010-249797 A | 11/2010 |
| JP | 2011-133414 A | 7/2011 |
| JP | 2011-215083 A | 10/2011 |
| JP | 2011-220917 A | 11/2011 |
| JP | 2011-258337 A | 12/2011 |
| JP | 2012-008134 A | 1/2012 |
| JP | 2012-037337 A | 2/2012 |
| WO | WO 2008-026476 A1 | 3/2008 |
| WO | WO 2008-026477 A1 | 3/2008 |

\* cited by examiner

CONDITION ESTIMATION DEVICE AND METHOD OF GENERATING OPEN CIRCUIT VOLTAGE CHARACTERISTIC

CROSS-REFERENCE TO RELATED APPLICATIONS

This application claims priority from Japanese Patent Application No. 2012-208490 filed on Sep. 21, 2012. The entire content of this priority application is incorporated herein by reference.

FIELD

Technologies described herein relates to a technology for estimating an internal condition of an electric storage device.

BACKGROUND

Conventionally, electric storage devices that are repeatedly useable, such as secondary batteries, have been used. The field of use of the electric storage devices including electric vehicles is currently expanding.

Conventionally, a technology for estimating a deterioration level of a secondary battery using an open circuit voltage characteristic of the secondary battery has been known (e.g., JP-A-2011-220917). In the secondary battery, information on a correlation between electrode potentials (positive electrode potential and negative electrode potential) and a battery capacity varies according to deterioration. In the conventional technology, the open circuit voltage characteristic that represents information on a correlation between the open circuit voltage and the internal condition of the secondary battery is measured. Then, parameters including a capacity retention rate of the positive electrode, a capacity retention rate of the negative electrode, and a variation in battery capacity are estimated such that the parameters correspond to the measured open circuit voltage characteristic. In the conventional technology, the parameters are estimated and the information on a correlation between the electrode potential of the secondary battery and the battery capacity thereof is defined. Then, the deterioration level of the secondary battery is estimated.

Unlike the conventional technology, a deterioration level of an electric storage device such as a secondary battery can be estimated based on the open circuit voltage characteristic of the electric storage device, which is estimated by defining information on a correlation between an electrode potential of the electric storage device and an electric storage capacity thereof. In this case, a process for defining the information may be complicated if the conventional technology is used to define the information because the conventional technology includes multiple processes for individually estimating multiple parameters. Therefore, the open circuit voltage characteristic of the electric storage device cannot be easily estimated.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

This specification describes a technology for easily estimating an open circuit voltage characteristic of an electric storage device in a condition estimation device for estimating an internal condition of the electric storage device.

A condition estimation device disclosed in this specification is a condition estimation device for estimating an internal condition of an electric storage device. The condition estimation device includes a voltage measurement circuit, memory, and a controller. The voltage measurement circuit is configured to measure an open circuit voltage of the electric storage device. The memory is configured to store first correlation information and second correlation information. The first correlation information is information on a correlation between a positive electrode potential at a positive electrode of the electric storage device and an electric storage capacity thereof. The second correlation information is information on a correlation between a negative electrode potential at a negative electrode of the electric storage device and an electric storage capacity thereof. The controller is configured to: measure an open circuit voltage of the electric storage device under charge or discharge; calculate a calculated electric storage capacity of the electric storage device having the open circuit voltage equal to a reference voltage; correct at least one of the first correlation information and the second correlation information such that a potential difference between the positive electrode potential and the negative electrode potential at the calculated electric storage capacity is equal to the reference voltage; and generate an open circuit voltage characteristic representing a correlation between the open circuit voltage of the electric storage device and the internal condition thereof based on the first correlation information and the second correlation information after the at least one of the first correlation information and the second correlation information is corrected.

BRIEF DESCRIPTION OF DRAWINGS

The foregoing and other features of the present invention will become apparent from the following description and drawings of an illustrative embodiment of the invention in which.

DESCRIPTION OF EMBODIMENTS

According to a first aspect, there is provided a condition estimation device for estimating an internal condition of an electric storage device. The condition estimation device includes a voltage measurement circuit, memory, and a controller. The voltage measurement circuit is configured to measure an open circuit voltage of the electric storage device. The memory is configured to store first correlation information and second correlation information. The first correlation information is information on a correlation between a positive electrode potential at a positive electrode of the electric storage device and an electric storage capacity thereof. The second correlation information is information on a correlation between a negative electrode potential at a negative electrode of the electric storage device and an electric storage capacity thereof. The controller is configured to: measure an open circuit voltage of the electric storage device under charge or discharge; calculate a calculated electric storage capacity of the electric storage device having the open circuit voltage equal to a reference voltage; correct at least one of the first correlation information and the second correlation information such that a potential difference between the positive electrode potential and the negative electrode potential at the calculated electric storage capacity is equal to the reference voltage; and generate an open circuit voltage characteristic representing a correlation between the open circuit voltage of the electric storage device and the internal condition thereof based on the first correlation information and the second correlation information after the at least one of the first correlation information and the second correlation information is corrected.

In the condition estimation device according to the first aspect, to generate the open circuit voltage characteristic, the correlation information stored in the memory in advance is corrected with a condition in which the potential difference between the positive electrode potential and the negative electrode potential at the calculated electric storage capacity is equal to the reference voltage and the open circuit voltage characteristic is generated using the corrected information. In comparison to the conventional technology that requires the estimation of multiple parameters to estimate an open circuit voltage characteristic, the open circuit voltage characteristic can be easily generated.

According to a second aspect, the controller is further configured to: determine a correction value based on the calculated electric storage capacity in the correction of the at least one of the first correlation information and the second correlation information; and shift the electric storage capacity associated with an electrode potential of the electric storage device by the correction value for at least one of the first correlation information and the second correlation information.

In the condition estimation device according to the second aspect, to correct the correlation information and generate the open circuit voltage characteristic, the at least one of the first correlation information and the second correlation information is corrected by shifting the electric storage capacity associated with the electrode potential of the electric storage device. Therefore, it is not necessary to store multiple pieces of correlation information containing shifted electric storage capacities in the memory for the first correlation information and the second correlation information and thus a capacity required for the memory can be reduced.

According to a third aspect, the controller is further configured to: determine a correction value based on the calculated electric storage capacity in the correction of the at least one of the first correlation information and the second correlation information; and decrease or increase the electric storage capacity associated with an electrode potential of the electric storage device by the correction value for at least one of the first correlation information and the second correlation information.

In the condition estimation device according to the third aspect, to correct the correlation information and generate the open circuit voltage characteristic, the electric storage capacity associated with the electrode potential of the electric storage device is decreased or increased for at least one of the first correlation information and the second correlation information. Therefore, it is not necessary to store multiple pieces of correlation information containing decreased electric storage capacities or increased electric storage capacities in the memory for the first correlation information and the second correlation information and thus a capacity required for the memory can be reduced.

According to a fourth aspect, the controller is further configured to: correct one of the first correlation information and the second correlation information; and determine the correction value based on the electrode potential at the calculated electrode storage capacity in the other one of the first correlation information and the second correlation information, which is not corrected in the correction of the at least one of the first correlation information and the second correlation information.

In the condition estimation device according to the fourth aspect, to correct the correlation information and generate the open circuit voltage characteristic, one of the first correlation information and the second correlation information is corrected. To correct the correlation information, the correction value can be determined based on the correlation information that is not corrected and thus the correlation information can be easily corrected.

According to a fifth aspect, the controller is further configured to correct one of the first correlation information and the second correlation information whichever related to one of the positive electrode and the negative electrode having a smaller electrode capacity in the correction of the at least one of the first correlation information and the second correlation information.

In the condition estimation device according to the fifth aspect, to correct the correlation information and generate the open circuit voltage characteristic, the correlation information related to the electrode having a smaller electrode capacity is corrected. In general, the correlation information related to the electrode of the electric storage device having a smaller electrode capacity tends to vary and the open circuit voltage characteristic of the electric storage device varies according to the variation in the information. By correcting the correlation information related to the electrode having a smaller electrode capacity, the open circuit voltage characteristic can be accurately generated.

According to a sixth aspect, the controller is further configured to correct the second correlation information in the correction of the at least one of the first correlation information and the second correlation information.

In the condition estimation device according to the sixth aspect, to correct the correlation information and generate the open circuit voltage characteristic, the second correlation information related to the negative electrode is corrected. In general, the electrode capacity of the negative electrode is set smaller than that of the positive electrode. By correcting the correlation information related to the negative electrode having a smaller electrode capacity, the open circuit voltage characteristic can be accurately generated.

According to a seventh aspect, the memory is configured to store a correction value correspondence table containing a first correction value corresponding to the first correlation information and a second correction value corresponding to the second correlation information in correspondence with the electric storage device. The controller is further configured to correct the first correlation information and the second correlation information in the correction of the at least one of the first correlation information and the second correlation information using the first correction value and the second correction value contained in the correction value correspondence table in correspondence with the calculated electric storage capacity.

In the condition estimation device according to the seventh aspect, to correct the correlation information and generate the open circuit voltage characteristic, the first correlation information and the second correlation information are both corrected. In this case, the correction values are determined using the correction value correspondence table stored in the memory in advance. Therefore, even in the case that the first correlation information and the second correlation information are both corrected, the correlation information can be easily corrected.

According to an eighth aspect, the controller is further configured to: calculate an open circuit voltage of the electric storage device by subtracting the negative electrode potential from the positive electrode potential associated with the same electric storage capacity in the first correlation information and the second correlation information; and generate an open circuit voltage characteristic based on information on a correlation between the open circuit voltage and the electric storage capacity.

In the condition estimation device according to the eighth aspect, the open circuit voltage characteristic is generated based on the positive electrode potential in the first correlation information and the negative electrode potential in the second correlation information. Therefore, the open circuit voltage characteristic can be easily generated.

According to a ninth aspect, the first correlation information and the second correlation information are measured when the electric storage device is in an early stage of use and stored in the memory.

In the condition estimation device according to the ninth aspect, the open circuit voltage characteristic is generated based on the first correlation information and the second correlation information measured when the electric storage device is in an early stage of use. Therefore, the open circuit voltage characteristic appropriate for the characteristic of the electric storage device can be generated.

According to a tenth aspect, there is provided a method of generating an open circuit voltage characteristic representing information on a correlation between an open circuit voltage of an electric storage device and an internal condition thereof. The method includes: measuring an open circuit voltage of the electric storage device under charge or discharge; calculating a calculated electric storage capacity of the electric storage device having the open circuit voltage equal to a reference voltage; correcting at least one of first correlation information and second correlation information such that a potential difference between the positive electrode potential and the negative electrode potential at the calculated electric storage capacity is equal to the reference voltage; and generating an open circuit voltage characteristic based on the first correlation information and the second correlation information after the at least one of the first correlation information and the second correlation information is corrected.

According to the invention disclosed in this specification, an open circuit voltage characteristic of an electric storage device can be easily estimated in the condition estimation device for estimating an internal condition of the electric storage device.

First Embodiment

A first embodiment will be described with reference to FIGS. 1 to 6.

1. Configuration of Battery Pack

Figure 1:
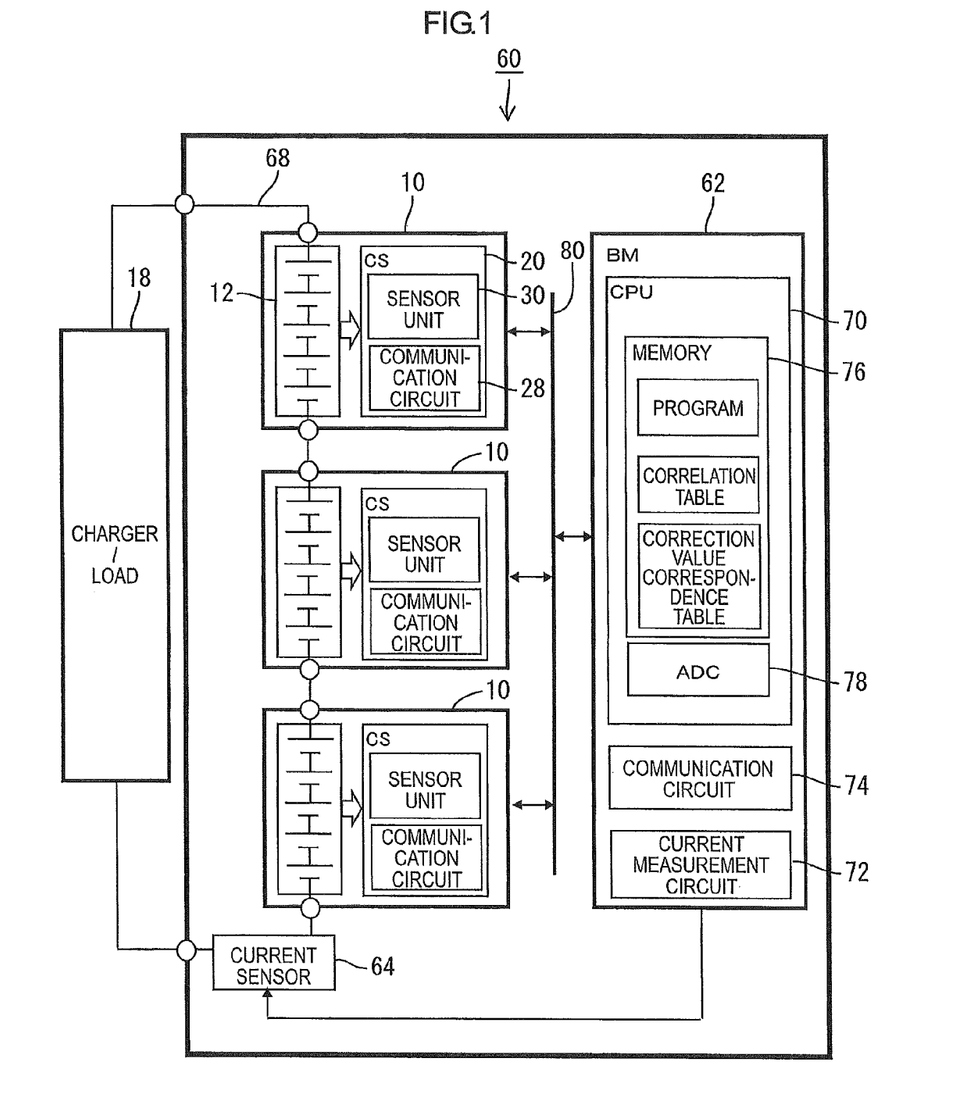
FIG. 1 is a schematic diagram illustrating a configuration of a battery pack.

A configuration of a battery pack 60 according to this embodiment is illustrated in FIG. 1. The battery pack 60 is installed in an electric vehicle or a hybrid vehicle, for example, to supply power to an electrically-powered device that operates with electrical energy.

As illustrated in FIG. 1, the battery pack 60 includes battery modules 10, a battery manager (hereinafter referred to as the BM) 62, and a current sensor 64. Each battery module 10 includes an assembled battery 12 and a cell sensor (hereinafter referred to as the CS) 20. The assembled battery 12 includes cells 14 (see FIG. 2). The cell sensor 20 is a board on which a sensor unit 30 and a communication circuit 28 are arranged. The BM 62 manages the battery module 10. The BM 62 and the CS 20 are an example of a condition estimation device. Each cell 14 is an example of an electric storage device.

The assembled batteries 12 in the battery modules 10 and the current sensor 64 are connected in series via an electric line 68 and to a charger/load 18. The charger of the charger/load 18 is an external device provided outside the vehicle. The load of the charger/load 18 is an electrically-powered device provided inside the vehicle.

The BM 62 includes a central processing unit (hereinafter referred to as the CPU) 70, a current measurement circuit 72, and a communication circuit 74. The current measurement circuit 72 measures a current I of a charge current or a discharge current (hereinafter referred to as a charge/discharge current) of each assembled battery 12 every predetermined period using the current sensor 64. The CPU 70 is an example of a controller.

As illustrated in FIG. 1, the CPU 70 includes memory 76 and an analog-digital converter (hereinafter referred to as the ADC) 78. Examples of the memory 76 include ROM and RAM. The ADC 78 converts the current I that is measured as an analog signal to a digital value. The memory 76 stores various programs for controlling operations of the CS 20 (including a battery management program). The CPU 70 controls sections of the battery pack 60 according to programs read out of the memory 76, for example, by executing an open circuit voltage characteristic generation process, which will be described later.

Figure 5:
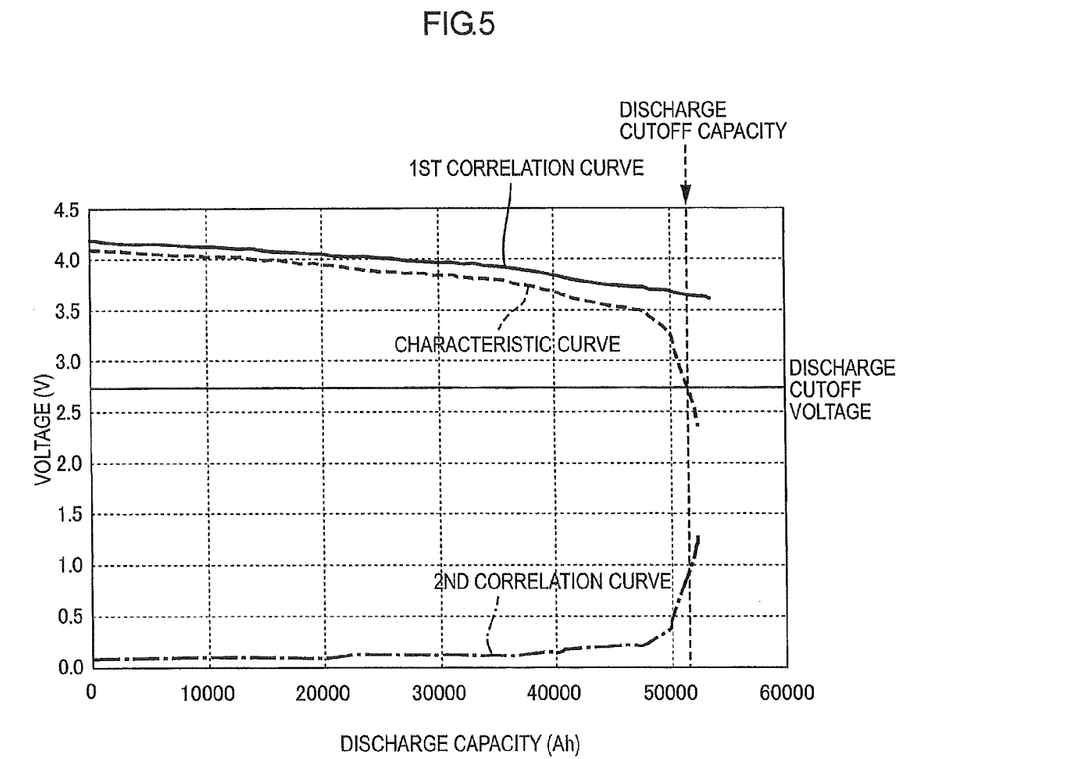
FIG. 5 is a graph illustrating a correlation between a discharge capacity and a voltage of the cell that is in an early stage of use.

The memory 76 stores a first correlation table (corresponding to a solid-line curve in FIG. 5) and a second correlation table (corresponding to a chain-line curve in FIG. 5). The first correlation table represents a correlation between a positive electrode potential of the cell 14 and the discharge capacity thereof. The second correlation table represents a correlation between a negative electrode potential of the cell 14 and the discharge capacity thereof. Contents of the first and the second correlation table are defined based on a combination of an active material of the cell 14 and a material of the positive electrode and based on a combination of an active material of the cell 14 and a material of the negative electrode. In this embodiment, the contents of the first and the second correlation table are calculated using the cell 14 that is in an early stage of use. However, the contents may be calculated using the same active material and electrodes made of the same material and stored in the memory 76. The discharge capacity is an example of an electric storage capacity. The first correlation table is an example of a first correlation information. The second correlation table is an example of a second correlation information.

The communication circuit 74 is connected to the CSs 20 in the battery modules 10 via a communication line 80. The communication circuit 74 receives information including voltages V and temperatures D measured in the CSs 20, which will be described later. The CPU 70 controls charge and discharge of the assembled batteries 12 using the information and estimates SOCs of the cells 14. The SOC stands for state of charge, which represents a charged condition of an electric storage device. When the electric storage device is fully charged, the SOC thereof is 100%. When the electric storage device is fully discharged, the SOC thereof is 0%.

The battery pack 60 also includes an operation unit (not illustrated) for receiving inputs from a user and a liquid crystal display (not illustrated) for displaying deterioration levels of the assembled batteries 12 and other information.

Figure 2:
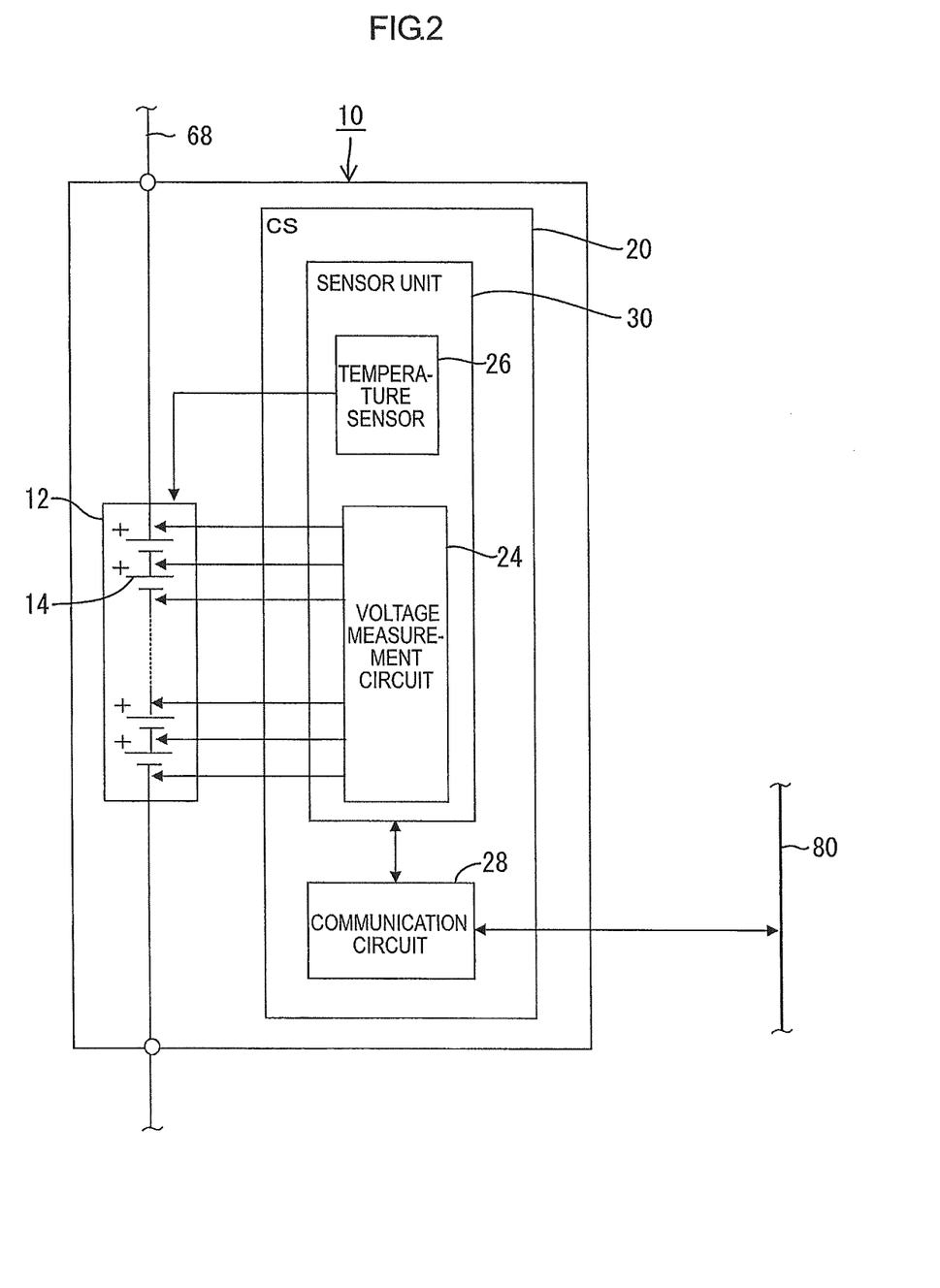
FIG. 2 is a schematic diagram illustrating a configuration of a battery module.

A schematic configuration of the battery module 10 is illustrated in FIG. 2. Each assembled battery 12 includes the cells 14 connected in series. Each cell 14 is a secondary battery that is repeatedly chargeable and dischargeable. More specifically, the cell 14 is a lithium ion battery, a voltage across which is approximately 4V when fully charged, and which includes a metal oxide containing two or more kinds of lithium as a positive electrode active material. For example, the metal oxide may contain one, two or more kinds of elements such as cobalt (Co), manganese (Mn), and nickel (Ni). The positive electrode active material is prepared by mixing a lithium-contained metal oxide having a spinel structure and a lithium-contained metal oxide having a layer structure. Each CS 20 includes a sensor unit 30 and a communication circuit 28. The sensor unit 30 includes a voltage measurement circuit 24 and a temperature sensor 26. The voltage measurement circuit 24 is an example of a voltage measurement circuit.

The voltage measurement circuit 24 is connected across each cell 14 in the assembled battery 12. The voltage measurement circuit 24 measures a voltage V (V) across each cell 14 every predetermined period. The temperature sensor 26 is a contact-type or a non-contact-type sensor. The temperature sensor 26 measures a temperature D (° C.) of each cell 14 in the assembled battery 12 every predetermined period. The voltage V across each cell 14 is an example of an open circuit voltage.

The communication circuit 28 is connected to the BM 62 via the communication line 80. The communication circuit 28 sends information including the voltage V and the temperature D measured by the CS 20 to the BM 62. The BM 62 stores the voltage V and the temperature D sent by each CS 20 in the memory 76.

2. Open Circuit Voltage Characteristic Generation Process

Figure 3:
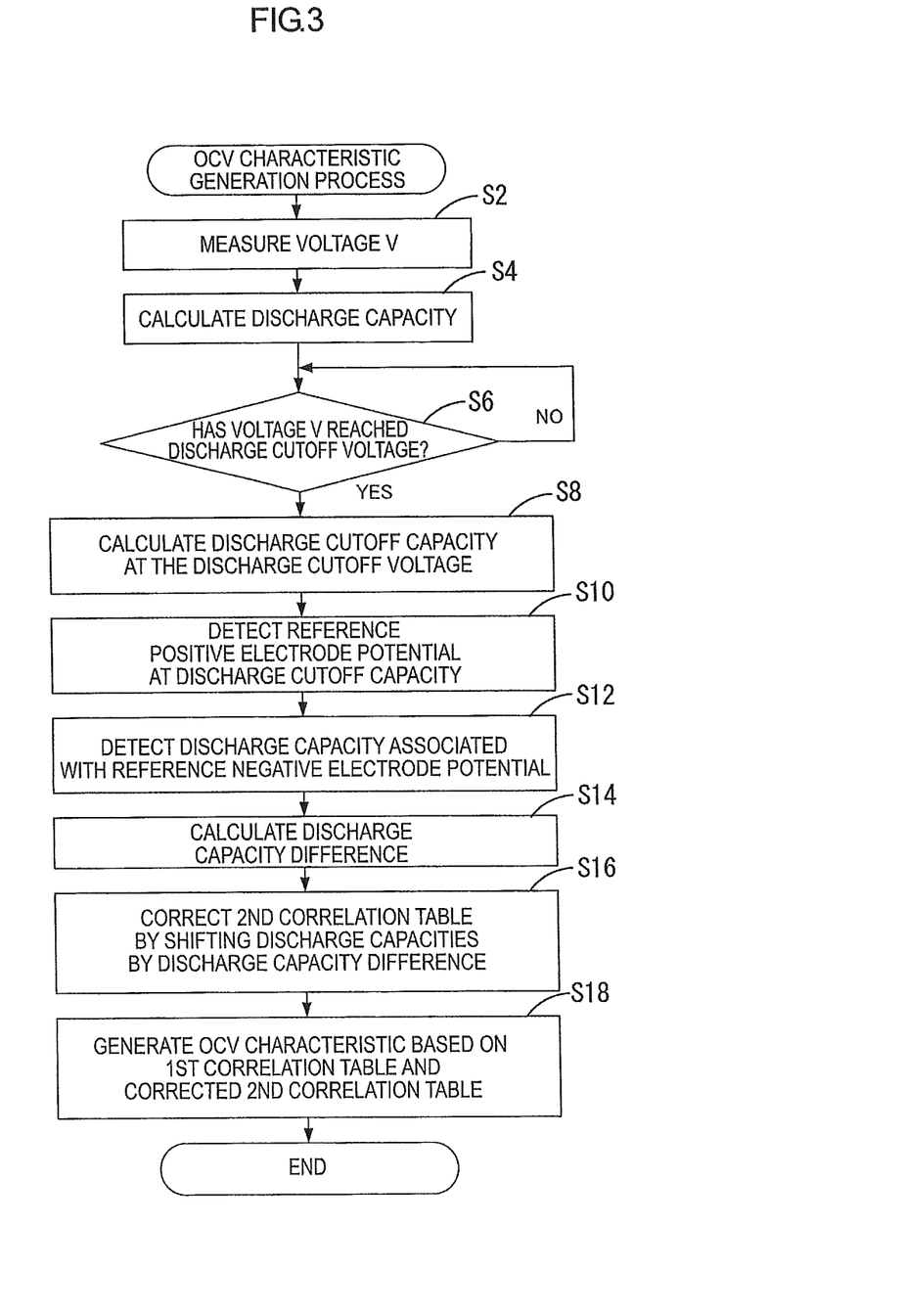
FIG. 3 is a flowchart of an open circuit voltage characteristic generation process according to a first embodiment.

The open circuit voltage characteristic generation process for generating an open circuit voltage characteristic of each cell 14 will be described with reference to FIGS. 3 to 6. A flowchart of the open circuit voltage characteristic generation process executed by the CPU 70 in the BM 62 is illustrated in FIG. 3. In the open circuit voltage characteristic generation process, the voltage V of the cell 14 under discharge is measured and the open circuit voltage characteristic is generated. The open circuit voltage characteristic is generated based on the measured voltage V and the correlation table stored in the memory 76. The open circuit voltage characteristic represents a correlation between the open circuit voltage of the cell 14 and the SOC thereof. The SOC represents a remaining capacity. The SOC is an example of an internal condition.

The SOCs of the cells 14 are estimated in sequence in the assembled battery 12 of each CS 20. The voltage V measured while the cell 14 is under charge or discharge is not necessarily equal to the open circuit voltage thereof. However, the voltage V can be treated the same as the open circuit voltage using a known technology for estimating an open circuit voltage based on the voltage V or using a predetermined correction factor.

When the battery pack 60 is activated by the user, for example, by turning on the electric vehicle or starting the charge of the electric vehicle, the BM 62 and the CSs 20 are activated and then charge or discharge of the assembled batteries 12 starts. When the BM 62 is activated, the CPU 70 executes the open circuit voltage characteristic generation process and a condition estimation process using the open circuit voltage characteristic generated in the open circuit voltage characteristic generation process.

After the open circuit voltage characteristic generation process is started, the CPU 70 starts the discharge of the cell 14 and measurement of the temperature D and the voltage V of the cell 14 using the CS 20 in the battery module 10 (S2). The CPU 70 also measures the currents I using the current measurement circuit 72, accumulates the currents I measured since the start of the discharge, and calculates the discharge capacity (S4).

The CPU 70 estimates the discharge capacity of the cell 14 at the start of discharge to calculate the discharge capacity. The CPU 70 continuously controls the charge and the discharge of the cell 14, for example. If information on the discharge capacity at the start of discharge is obtained in advance, the CPU 70 defines the obtained discharge capacity as the discharge capacity at the start of discharge.

Figure 4:
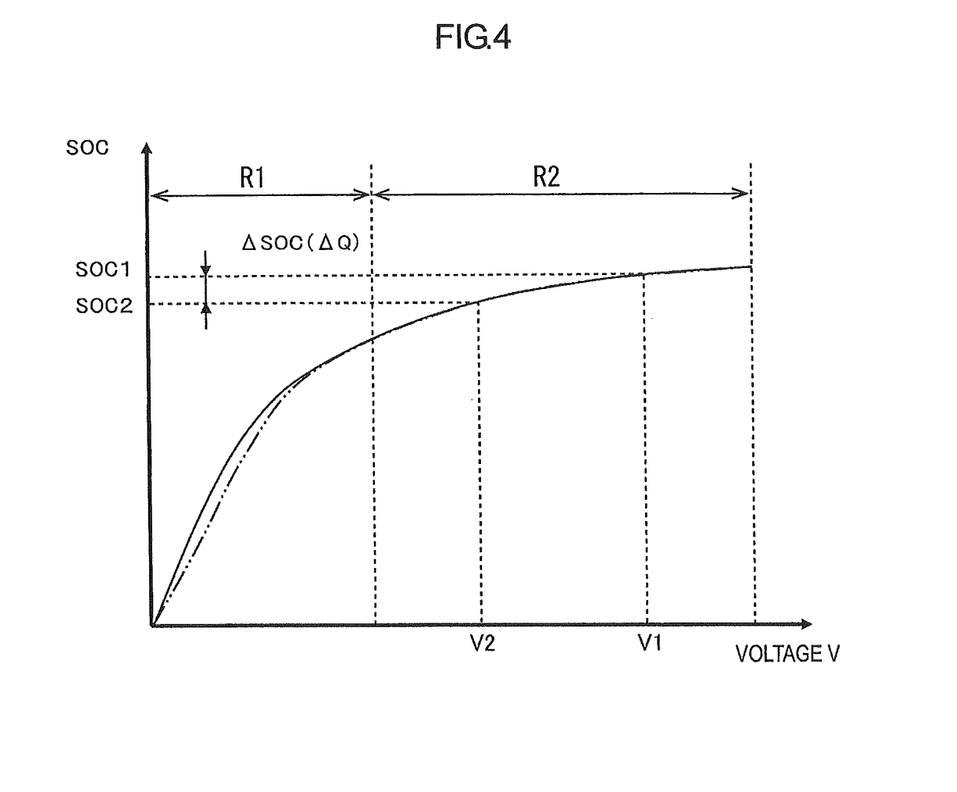
FIG. 4 is a graph illustrating a relationship between deterioration and a variation in open circuit voltage characteristic of a cell.

The CPU 70 may be configured to estimate the discharge capacity at the start of discharge based on the current of the cell 14 at the start of discharge and the preobtained open circuit voltage characteristic thereof. The open circuit voltage characteristic of the cell 14 is illustrated in FIG. 4. The open circuit voltage characteristic of the cell 14 varies from the open circuit voltage characteristic expressed by a solid line in FIG. 4 to the open circuit voltage characteristic expressed by a two-dot chain line in FIG. 4 according to the deterioration of the cell 14. The solid line expresses the open circuit voltage characteristic of the cell 14 in the early stage of use. The two-dot chain line expresses the open circuit voltage characteristic of the cell 14 in a stage of use after a predetermined period has passed. As illustrated in FIG. 4, there may be a variation region R1 and a non-variation region R2. The open circuit voltage characteristic of the cell 14 in the stage of use after the predetermined period has passed varies from that of the cell 14 in the early stage of use in the variation region R1 due to deterioration. The open circuit voltage characteristic of the cell 14 in the stage of use after the predetermined period has passed does not vary from that of the cell 14 in the early stage of use in the non-variation region R2 even when the cell 14 is deteriorated.

If the open circuit voltage characteristic of the cell 14 in the early stage of use is obtained in advance and the voltage V of the cell 14 at the start of discharge is in the non-variation region R2, the CPU 70 estimates the discharge capacity at the start of discharge based on the open circuit voltage characteristic of the cell 14 in the early stage of use. Specifically, the CPU 70 performs a pre-discharge in which the cell 14 is discharged for a predetermined short period, and obtains a voltage V1 before the pre-discharge, a remaining capacity SOC1 corresponding to the voltage V1, a voltage V2 after the pre-discharge, and a remaining capacity SOC2 corresponding to the voltage V2 illustrated in FIG. 4. The CPU 70 calculates a remaining capacity difference ΔSOC that is a difference between the remaining capacities SOC1 and SOC2. The CPU 70 calculates a discharge capacity difference ΔQ based on the current I measured during the pre-discharge. The CPU 70 estimates the discharge capacity of the cell 14 at the start of discharge by comparing the calculated remaining capacity difference ΔSOC with the calculated discharge capacity difference ΔQ.

The CPU 70 determines whether the voltage V of the cell 14 has reached a discharge cutoff voltage (S6). The CPU 70 waits until the voltage V of the cell 14 reaches the discharge cutoff voltage (NO in step S6). If the voltage V of the cell 14 has reached the discharge cutoff voltage (YES in step S6), the CPU 70 calculates a discharge cutoff capacity that is a discharge capacity at the discharge cutoff voltage (S8). The discharge cutoff voltage is an example of a reference voltage and the discharge cutoff capacity is an example of a calculated electric storage capacity.

A characteristic curve that represents a correlation between the voltage V and the discharge capacity of the cell 14 in the early stage of use is illustrated in FIG. 5. The characteristic curve can be calculated using the first correlation table and the second correlation table. A voltage V at a specific discharge capacity can be calculated by subtracting a negative electrode potential in the second correlation table from a positive electrode potential in the first correlation table at the specific discharge capacity. Therefore, the discharge capacity at which the potential difference between the positive electrode potential and the negative electrode potential is equal to the discharge cutoff voltage can be calculated as the discharge cutoff capacity.

Figure 6:
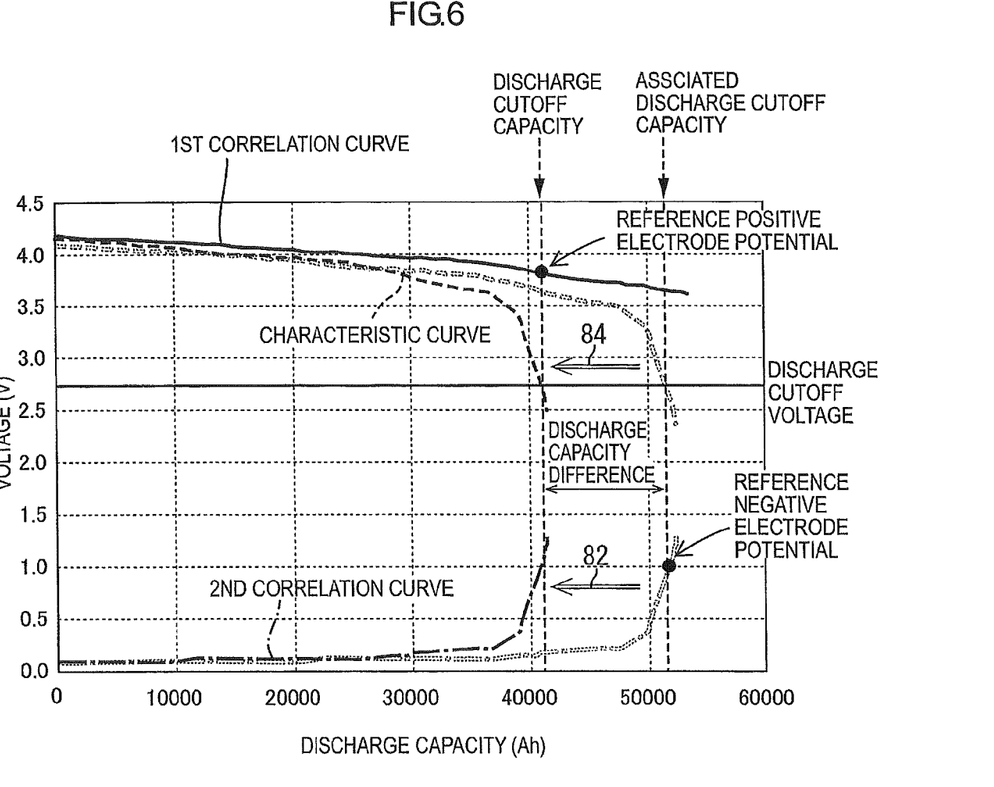
FIG. 6 is a graph illustrating a correlation between a discharge capacity and a voltage of a cell that is in use.

In FIG. 6, a first correlation curve and a second correlation curve are drawn from the first correlation table and the second correlation table, respectively. As illustrated in FIG. 6, when the cell 14 is deteriorated through the use thereof, at least one of the first correlation curve and the second correlation curve varies from that of the cell 14 in the early stage of use. In FIG. 6, the second correlation curve has varied due to the deterioration of the cell 14. Therefore, the characteristic curve of the cell 14 that is currently in use cannot be calculated using the first correlation curve and the second correlation curve.

In this embodiment, the CPU 70 calculates the characteristic curve of the cell 14 that is in use by correcting the correlation curve to be adjusted to the variation of the correlation curve and using the corrected correlation curve. Between the positive electrode and the negative electrode of the cell 14, the negative electrode has a smaller electrode capacity than the positive electrode. In this embodiment, a correction process is performed to correct the second correlation table corresponding to a negative electrode capacity (S10 to S16). Specifically, the CPU 70 shifts the discharge capacities stored in association with the negative electrode potentials in the second correlation table to correct the second correlation table.

In the correction process, the CPU 70 detects a positive electrode potential at the discharge cutoff capacity as a reference positive electrode potential from the first correlation table that is not corrected (S10). The CPU 70 detects a discharge capacity associated with a reference negative electrode potential, a potential difference between which and the reference positive electrode potential is equal to the discharge cutoff voltage, as a corresponding discharge capacity from the second correlation table (S12). The CPU 70 calculates a discharge capacity difference by subtracting the corresponding discharge capacity from the discharge cutoff capacity (S14). The discharge capacity difference is an example of a correction value.

The CPU 70 subtracts the discharge capacity difference from each discharge capacity associated with the negative electrode potential in the second correlation table and shifts the discharge capacities in the second correlation table (S16). As a result, the second characteristic curve of the cell 14 is corrected as illustrated with an arrow 82 in FIG. 6. Namely, the second characteristic curve expressed by a white chain line having an outline formed by fine dots is corrected to the second characteristic curve expressed by a black chain line. As a result, the characteristic curve of the cell 14 is also corrected as illustrated with an arrow 84 in FIG. 6. Namely, the characteristic curve expressed by a white dashed line having an outline formed by fine dots is corrected to the characteristic curve expressed by a black dashed line. A voltage calculated by subtracting the negative electrode potential in the corrected second correlation table from the positive electrode potential at the discharge cutoff capacity in the first correlation table is defined as the discharge cutoff voltage.

After the correction process, the CPU 70 generates the open circuit voltage characteristic based on the first correlation table and the corrected second correlation table (S18). The CPU 70 subtracts the negative electrode potential in the corrected second correlation table from the positive electrode potential in the first correlation table associated with the same discharge capacity and estimates the voltage V of the cell 14 corresponding to the discharge capacity (see the dashed line in FIG. 6). The CPU 70 calculates the SOC by subtracting a value calculated by dividing the discharge capacity associated with the estimated voltage V by the discharge cutoff capacity from 1 and generates the open circuit voltage characteristic that represents a correlation between the SOC and the voltage V.

Through the open circuit voltage characteristic generation process, the CPU 70 generates the open circuit voltage characteristic of the cell 14 that is used for more than the predetermined period, which corresponds to the curve expressed by the two-dot chain line in FIG. 4. After the open circuit voltage characteristic generation process, the CPU 70 executes a condition estimation process using the open circuit voltage characteristic generated in the open circuit voltage characteristic generation process.

3. Effects of This Embodiment (1) In the battery module 10 according to this embodiment, the second correlation table stored in the memory 76 in advance is corrected with a condition in which the voltage V at the discharge cutoff capacity is equal to the discharge cutoff voltage to generate the open circuit voltage characteristic. Then, the open circuit voltage characteristic is generated using the corrected second correlation table. The open circuit voltage characteristic curve can be generated using a single parameter that is the voltage V at the discharge cutoff capacity. In comparison to the conventional technology that requires estimation of multiple parameters, the open circuit voltage characteristic of an electric storage device can be easily generated.

(2) In the battery module 10 of this embodiment, the discharge capacity difference is calculated to correct the second correlation table. The second correlation table is corrected by shifting the electric storage capacities associated with the negative electrode potential of the cell 14 by the discharge capacity difference. In comparison to a configuration in which multiple second correlation tables, contents of which are shifted by the electric storage capacities, are stored in the memory 76 and one of the second correlation tables appropriate for the condition of the cell 14 is selected, a capacity required for storing the second correlation tables in the memory 76 can be reduced.

(3) In the battery module 10 of this embodiment, the discharge capacity difference is calculated based on the first correlation table that is not corrected to correct the second correlation table. Therefore, the discharge capacity difference can be easily and accurately calculated using the first correlation table stored in the memory 76 in advance.

(4) In the battery module 10 of this embodiment, the second correlation table related to the negative electrode of the cell 14 having a smaller electrode capacity than the positive electrode thereof. In general, the correlation related to the electrode of the cell 14 having a smaller electrode capacity tends to vary and the open circuit voltage characteristic thereof varies according to the variation in the correlation. In general, the negative electrode capacity of the cell 14 is set smaller than the positive electrode capacity thereof. In this battery module 10, the second correlation table related to the negative electrode capacity, which is smaller then the positive electrode capacity, is corrected. Therefore, the open circuit voltage characteristic can be accurately generated.

(5) In the battery module 10 of this embodiment, the voltage V of the cell 14 is estimated based on the positive electrode potential in the first correlation table and the negative electrode potential in the second correlation table associated with the same discharge capacity to generate the open circuit voltage characteristic. The open circuit voltage characteristic is generated based on the correlation between the estimated voltage V and the discharge capacity. According to the battery module 10, the open circuit voltage characteristic can be easily generated using the corrected second correlation table.

(6) In the battery module 10 of this embodiment, the open circuit voltage characteristic is generated based on contents in the first correlation table and contents in the second correlation table calculated using the cell 14 in the early stage of use. Therefore, the open circuit voltage characteristic curve appropriate for the characteristic of the cell 14 can be accurately generated.

Second Embodiment

A second embodiment will be described with reference to FIGS. 7 and 8. This embodiment is different from the first embodiment in that discharge capacities stored in a second correlation table corresponding to negative electrode potentials are reduced to correct the second correlation table. In the following description, the same configurations will not be described.

1. Open Circuit Voltage Characteristic Generation Process

Figure 7:
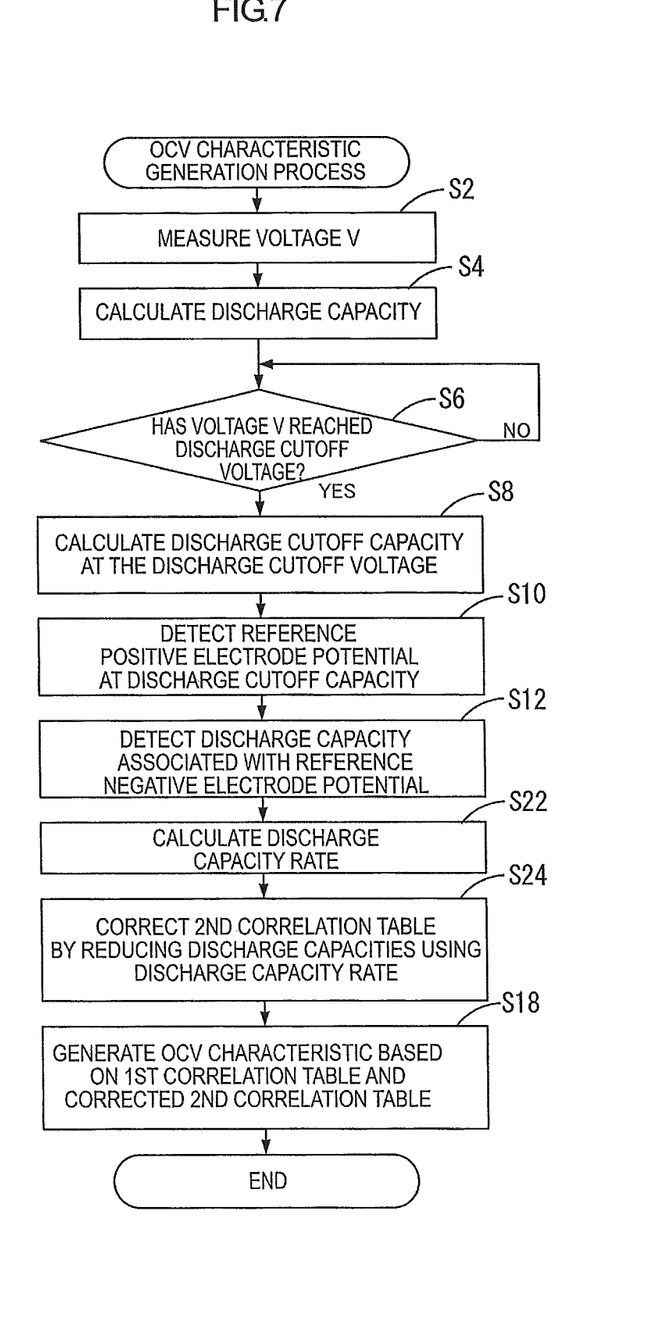
FIG. 7 is a flowchart of an open circuit voltage characteristic generation process according to a second embodiment.

A flowchart of an open circuit voltage characteristic generation process of this embodiment executed by the CPU 70 in the BM 62 is illustrated in FIG. 7.

The CPU 70 calculates a discharge cutoff capacity (S8) and detects a corresponding discharge capacity (S12). The CPU 70 calculates a discharge capacity rate by dividing the discharge cutoff capacity by the corresponding discharge capacity (S22). The discharge capacity rate is another example of a correction value.

The CPU 70 corrects the second correlation table by reducing the discharge capacities associated with the negative electrode potentials in the second correlation table, specifically, by multiplying each discharge capacity by the discharge capacity rate (S24). As a result, the second correlation curve expressed by a white chain line having an outline foamed by fine dots in FIG. 8 is corrected to the second correlation curve expressed by a black chain line. The above change of the second correlation curve is illustrated with arrows 86 and 88 in FIG. 8. As a result, the characteristic curve of the cell 14 is also corrected. Namely, the characteristic curve expressed by a white dashed line having an outline formed by fine dots in FIG. 8 is corrected to the characteristic curve expressed by a black dashed line. The above change of the characteristic curve is illustrated with an arrow 90 in FIG. 8. After the correction process, the CPU 70 generates the open circuit voltage characteristic based on the first correlation table and the corrected second correlation table (S18).

2. Effects of This Embodiment

In the battery module 10 of this embodiment, the discharge capacity rate is calculated to correct the second correlation table and the second correlation table is corrected by reducing the electric storage capacities associated with the negative electrode potentials of the cell 14 using the discharge capacity rate. In comparison to a configuration in which multiple second correlation tables, the discharge capacities in which are increased or decreased with various rates, are stored in the memory 76 and one of the second correlation tables appropriate for the condition of the cell 14 is selected, a capacity required for storing the second correlation tables in the memory 76 can be reduced.

Third Embodiment

A third embodiment will be described with reference to FIG. 9. This embodiment is different from the first embodiment or the second embodiment in that the first correlation table and the second correlation table are both corrected to generate an open circuit voltage characteristic. In the following description, the same configurations as those of the first embodiment and the second embodiment will not be described.

1. Configuration of Battery Pack

The memory 76 of the CPU 70 stores correction value correspondence tables provided for the cells 14, respectively. Each correction value correspondence table contains first correction capacities for correcting the first correlation table and second correction capacities for correcting the second correlation table. The first correction capacities and the second correction capacities are stored associated with discharge capacities in the correction value correspondence table. The first correction capacities are an example of a first correction value and the second correction capacities are an example of a second correction value.

2. Open Circuit Voltage Characteristic Generation Process

Figure 9:
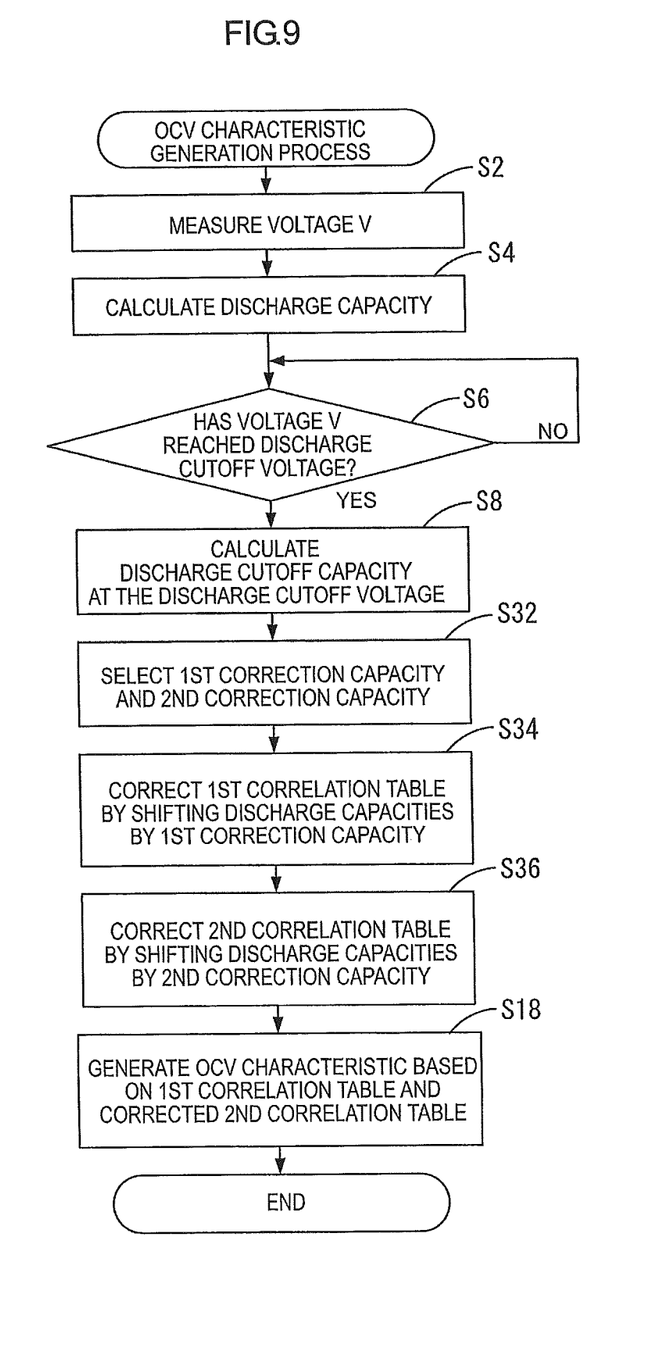
FIG. 9 is a flowchart of an open circuit voltage characteristic generation process according to a third embodiment.

A flowchart of an open circuit voltage characteristic generation process of this embodiment executed by the CPU 70 in the BM 62 is illustrated in FIG. 9.

The CPU 70 calculates a discharge cutoff capacity (S8) and selects the first correction capacity and the second correction capacity associated with the discharge cutoff capacity from the correction value correspondence table (S32). The CPU 70 subtracts the selected first correction capacity from each discharge capacity associated with the positive electrode potential in the first correlation table to shift the discharge capacities in the first correlation table (S34). The CPU 70 subtracts the selected second correction capacity from each discharge capacity associated with the negative electrode potential in the second correlation table to shift the discharge capacities in the second correlation table (S36). After the correction process, the CPU 70 generates the open circuit voltage characteristic based on the corrected first correlation table and the corrected second correlation table (S18).

3. Effects of This Embodiment

In the battery module 10 of this embodiment, the first correlation information and the second correlation information are both corrected to generate the open circuit voltage characteristic. Therefore, the open circuit voltage characteristic can be accurately generated. Each correction capacity is selected using the correction value correspondence table stored in the memory 76 in advance. Therefore, the correlation tables can be easily corrected.

Other Embodiments

The present invention is not limited to the embodiments described above and illustrated in the drawings. The following various embodiments are also included in the technical scope of the present invention.

(1) The cells 14 that are secondary batteries are used as an example of an electric storage device in the above embodiments. However, the electric storage device is not limited to such an example. Capacitors that exhibit electrochemical phenomenon may be used.

(2) The open circuit voltage characteristic is generated using the cell 14 under discharge in the above embodiments. The open circuit voltage characteristic curve may be generated using the cell 14 under charge.

(3) In the first and the second embodiments, the negative electrode capacity of the cell 14 is smaller than the positive electrode capacity thereof and the second correlation table corresponding to the negative electrode capacity is corrected. However, if the negative electrode capacity of the cell 14 is larger than the positive electrode capacity thereof, the first correction table corresponding to the positive electrode capacity may be corrected.

(4) In the first and the second embodiments, the currents I are measured using the current measurement circuit 72 to calculate the discharge capacity and the discharge capacity is calculated by accumulating the currents I since the start of discharge. However, a method of calculating the discharge capacity is not limited to such an example. For example, the discharge capacity may be estimated based on a temperature history or the number of charge-discharge cycles of the cell 14. The temperature history is a record of temperatures D of the cell 14. One cycle of the charge-discharge cycle of the cell 14 is counted when one series of one charge and one discharge is completed. If the battery is subjected to high temperatures, the capacity thereof decreases. Therefore, in the calculation of the discharge capacity using the temperature history, the discharge capacity may be estimated by estimating a decrease in capacity based on a period in which the battery is subjected to high temperatures. In the calculation of the discharge capacity using the number of cycles, the discharge capacity may be estimated by estimating a decrease in capacity based on the number of cycles.

(5) In the third embodiment, the first correction capacity and the second correction capacity are stored in the correction value correspondence table. The electric storage capacities associated with the positive electrode potential (or the negative electrode potential) of the cell 14 are corrected by shifting the electric storage capacities by the first correction capacity (or the second correction capacity) to correct the first correlation table (or the second correlation table). However, the correction of the first correlation table (or the second correlation table) is not limited to such an example. For example, the electric storage capacities associated with the positive electrode potential (or the negative electrode potential) may be corrected by decreasing or increasing the electric capacities using the first correction capacity (or the second correction capacity) to correct the first correlation table (or the second correlation table).

(6) In the above embodiments, the BM 62 including a single CPU 70 is used as an example of a controller. However, the controller may include multiple CPUs or a hardware circuit such as an application specific integrated circuit (ASIC). The controller may include both hardware circuit and CPU. Namely, the controller can have any configuration as long as the open circuit voltage characteristic process is executed through software processing or using a hardware circuit.

(7) In the above embodiments, the programs stored in the memory 76 are provided as examples of the programs that the CPU 70 reads and executes. However, the programs are not limited to such examples. Programs stored in a hard disk drive, a non-volatile memory such as a flash memory, or a recording medium such as a CD-R may be used.

REFERENCE EXAMPLE

A reference example will be described.

A condition estimation device described in this section is a condition estimation device for estimating an internal condition of an electric storage device. The condition estimation device includes a voltage measurement circuit, memory, and a controller. The voltage measurement circuit measures an open circuit voltage of the electric storage device. The memory stores an open circuit voltage characteristic that provides information on correlation between reference open circuit voltage of the electric storage device in a specific condition and electric storage capacity. The controller is configured to: measure an open circuit voltage of the electric storage device under charge or discharge; calculate a calculated electric storage capacity of the electric storage device having the open circuit voltage equal to a reference voltage; and correct the open circuit voltage characteristic such that the reference open circuit voltage at the calculated electric storage capacity is equal to the reference voltage.

In the condition estimation device of the reference example, the reference open circuit voltage at the calculated electric storage capacity is corrected with a condition in which the reference open circuit voltage at the calculated electric storage capacity is equal to the reference voltage to correct and generate the open circuit voltage characteristic stored in the memory in advance. In comparison to a configuration in which estimation of multiple parameters is required to estimate the open circuit voltage characteristic, the open circuit voltage characteristic of the electric storage device can be easily corrected and generated.

In the condition estimation device of this reference example, the open circuit voltage characteristic of a cell that is in an early stage of use, which is, for example, a curve expressed by a solid line in FIG. 4, is stored in the memory. The open circuit voltage characteristic is corrected to generate the open circuit voltage characteristic of the cell that is in use, which is expressed by a two-dot line in FIG. 4. This configuration is different from those of the first to the third embodiments.

Figure 8:
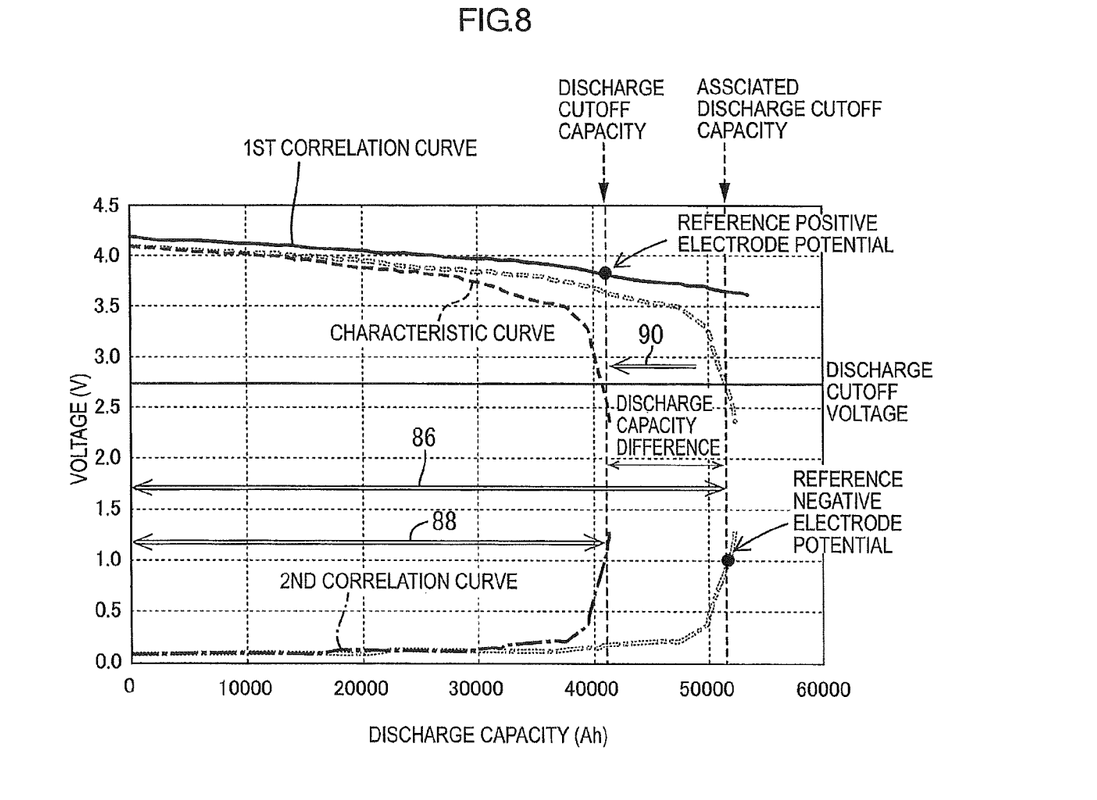
FIG. 8 is a graph illustrating a correlation between a discharge capacity and a voltage of a cell that is in use.

Specifically, the characteristic table of the cell 14 in the early stage of use corresponding to the characteristic curve expressed by a white chain line having an outline formed by fine dots in FIG. 8 is stored in the memory. The characteristic table contains the corresponding discharge capacity at which the voltage V is equal to the discharge cutoff voltage. The CPU calculates the discharge cutoff capacity at which the voltage V of the cell 14 that is in used is equal to the discharge cutoff voltage thereof. The CPU calculates the discharge capacity rate by dividing the discharge cutoff capacity by the corresponding discharge capacity.

The CPU multiplies each discharge capacity associated with the voltage V in the characteristic table by the discharge capacity rate to decrease the discharge capacities in the characteristic table. With this configuration, the characteristic curve expressed by the white chain line in FIG. 8 is corrected to the characteristic curve expressed by the black chain line as indicated by the arrow 90. The CPU generates the open circuit voltage characteristic using the corrected characteristic table.

The invention claimed is:

1. A condition estimation device for estimating an internal condition of an electric storage device, the condition estimation device comprising:
   a voltage measurement circuit configured to measure an open circuit voltage of the electric storage device;
   memory configured to store first correlation information and second correlation information, the first correlation information being information on a correlation between a positive electrode potential at a positive electrode of the electric storage device and an electric storage capacity thereof, the second correlation information being information on a correlation between a negative electrode potential at a negative electrode of the electric storage device and an electric storage capacity thereof; and
   a controller configured to:
      measure an open circuit voltage of the electric storage device under charge or discharge;
      calculate a calculated electric storage capacity of the electric storage device having the open circuit voltage equal to a reference voltage;
      correct at least one of the first correlation information and the second correlation information such that a potential difference between the positive electrode potential and the negative electrode potential at the calculated electric storage capacity is equal to the reference voltage; and
      generate an open circuit voltage characteristic representing a correlation between the open circuit voltage of the electric storage device and the internal condition thereof based on the first correlation information and the second correlation information after the at least one of the first correlation information and the second correlation information is corrected.

2. The condition estimation device according to claim 1, wherein the controller is further configured to:
   determine a correction value based on the calculated electric storage capacity in the correction of the at least one of the first correlation information and the second correlation information; and
   shift the electric storage capacity associated with an electrode potential of the electric storage device by the correction value for at least one of the first correlation information and the second correlation information.

3. The condition estimation device according to claim 2, wherein the controller is further configured to:
   correct one of the first correlation information and the second correlation information in the correction of the at least one of the first correlation information and the second correlation information; and
   determine the correction value based on the electrode potential at the calculated electrode storage capacity in the other one of the first correlation information and the second correlation information, which is not corrected.

4. The condition estimation device according to claim 3, wherein the controller is further configured to correct one of the first correlation information and the second correlation information whichever related to one of the positive electrode and the negative electrode having a smaller electrode capacity in the correction of the at least one of the first correlation information and the second correlation information.

5. The condition estimation device according to claim 4, wherein the controller is further configured to correct the second correlation information in the correction of the at least one of the first correlation information and the second correlation information.

6. The condition estimation device according to claim 2, wherein
   the memory is configured to store a correction value correspondence table containing a first correction value corresponding to the first correlation information and a second correction value corresponding to the second correlation information in correspondence with the electric storage device, and
   the controller is further configured to correct the first correlation information and the second correlation information in the correction of the at least one of the first correlation information and the second correlation information using the first correction value and the second correction value contained in the correction value correspondence table in correspondence with the calculated electric storage capacity.

7. The condition estimation device according to claim 1, wherein the controller is further configured to:
   determine a correction value based on the calculated electric storage capacity in the correction of the at least one of the first correlation information and the second correlation information; and
   decrease or increase the electric storage capacity associated with an electrode potential of the electric storage device by the correction value for at least one of the first correlation information and the second correlation information.

8. The condition estimation device according to claim 1, wherein the controller is further configured to:
   calculate an open circuit voltage of the electric storage device by subtracting the negative electrode potential from the positive electrode potential associated with the same electric storage capacity in the first correlation information and the second correlation information; and
   generate an open circuit voltage characteristic based on information on a correlation between the open circuit voltage and the electric storage capacity.

9. The condition estimation device according to claim 1, wherein the first correlation information and the second correlation information are measured when the electric storage device is in an early stage of use and stored in the memory.

10. A method of generating an open circuit voltage characteristic representing information on a correlation between an open circuit voltage of an electric storage device and an internal condition thereof, the method comprising:
   measuring an open circuit voltage of the electric storage device under charge or discharge;
   calculating a calculated electric storage capacity of the electric storage device having the open circuit voltage equal to a reference voltage;
   correcting at least one of first correlation information and second correlation information such that a potential difference between a positive electrode potential and a negative electrode potential at the calculated electric storage capacity is equal to the reference voltage; and
   generating an open circuit voltage characteristic representing a correlation between the open circuit voltage of the electric storage device and the internal condition thereof based on the first correlation information and the second correlation information after the at least one of the first correlation information and the second correlation information is corrected.

* * * * *